(12) United States Patent
Schnell et al.

(10) Patent No.: US 10,228,430 B2
(45) Date of Patent: Mar. 12, 2019

(54) METHOD FOR CRYOGENIC COOLING OF AN NMR DETECTION SYSTEM WITH THE ASSISTANCE OF A CONTAINER FILLED WITH A CRYOGENIC FLUID

(71) Applicant: BRUKER BIOSPIN AG, Faellanden (CH)

(72) Inventors: Marc A. Schnell, Zurich (CH); Marc Enrique Paredes, Zurich (CH); Cengiz Cetrefli, Zurich (CH); Philippe Stauffenegger, Duebendorf (CH); Daniel Marek, Schwerzenbach (CH)

(73) Assignee: Bruker BioSpin AG, Faellanden (CH)

( * ) Notice: Subject to any disclaimer, the term of this patent is extended or adjusted under 35 U.S.C. 154(b) by 694 days.

(21) Appl. No.: 14/296,476

(22) Filed: Jun. 5, 2014

(65) Prior Publication Data

US 2014/0283530 A1     Sep. 25, 2014

Related U.S. Application Data

(63) Continuation of application No. 12/926,113, filed on Oct. 27, 2010, now abandoned.

(30) Foreign Application Priority Data

Nov. 3, 2009    (DE) .................. 10 2009 046 321

(51) Int. Cl.
*G01R 33/34* (2006.01)
*G01R 33/31* (2006.01)

(52) U.S. Cl.
CPC ......... *G01R 33/3403* (2013.01); *G01R 33/31* (2013.01); *F17C 2227/0318* (2013.01); *F17C 2227/0395* (2013.01)

(58) Field of Classification Search
CPC ................................................ G01R 33/3403
See application file for complete search history.

(56) References Cited

U.S. PATENT DOCUMENTS

| 2007/0096734 A1* | 5/2007 | Lukens | G01R 33/34 |
| | | | 324/315 |
| 2011/0100027 A1* | 5/2011 | Schnell | G01R 33/31 |
| | | | 62/51.1 |

FOREIGN PATENT DOCUMENTS

| JP | 02-270913 | 6/1990 |
| JP | 2004-301773 | 10/2004 |
| JP | 2008-241493 | 10/2008 |

* cited by examiner

*Primary Examiner* — Tareq Alosh
(74) *Attorney, Agent, or Firm* — Paul Vincent

(57) ABSTRACT

A method for the transmission/reception of RF signals for NMR measurements uses a heat exchanger (1) for cooling heat sources (5), the heat exchanger having a contact element (4.2) for thermal connection between a cryogenic fluid and the heat source, is characterized in that the heat exchanger comprises a container having an interior volume $V_B$ into which a first cryogenic fluid $F_1$ that has a liquid component $F_{1L}$ and a gaseous component $F_{1G}$ flows through an inflow conduit (8) and from which a second cryogenic fluid $F_2$ that has liquid component $F_{2L}$ and a gaseous component $F_{2G}$ flows out through an outflow conduit (9). The inflow conduit has a flow cross-section $Q_Z$ and a circumference $U_Z$ from which an associated parameter $V_Z=4\cdot Q^2_Z/U_Z$ results, wherein $V_B>10\cdot V_Z$, and the outflow conduit has a flow diameter $Q_A$ wherein $Q_A \geq Q_Z$. The contact element is in close thermal contact with both the liquid volume component $V_L$ of the cryogenic fluid and with the heat source. A device for setting the inflow quantity of the first cryogenic fluid $F_1$ into the container is provided that ensures a state $F_{1L}/F_{1G}>F_{2L}/F_{2G}$ during operation. In this way, vibrations due to the cooling process can be largely reduced and the consumption of cryogenic fluid minimized.

17 Claims, 13 Drawing Sheets

PRIOR ART

PRIOR ART

A - A:

METHOD FOR CRYOGENIC COOLING OF AN NMR DETECTION SYSTEM WITH THE ASSISTANCE OF A CONTAINER FILLED WITH A CRYOGENIC FLUID

This application is a continuation of Ser. No. 12/926,113 filed Oct. 27, 2010 and claims Paris convention priority from DE 10 2009 046 321.6 filed Nov. 3, 2009, the entire disclosures of which are hereby incorporated by reference

BACKGROUND OF THE INVENTION

The invention relates to a method for structuring and operating a cryo probe head for the transmission and/or reception of radio-frequency signals for nuclear magnetic resonance measurements, with at least one heat exchanger for cooling one or more heat sources, in particular, components of the cryo probe head, wherein a cryogenic fluid is supplied to the heat exchanger and the heat exchanger has at least one contact element that ensures a connection with good thermal conduction between the cryogenic fluid and the heat source.

Such a configuration is known from DE 103 40 352 A1.

In a configuration for measurement by means of nuclear magnetic resonance, a probe head is placed in the strong steady-state magnetic field of a typically superconducting magnet. The sample to be measured is introduced into this. The probe head contains radio-frequency coils and resonators that are used to excite nuclear spins and to receive the signals generated by the excited nuclear spins. Because the nuclear spin signals are generally very weak, there are easily prone to interference. For that reason, the signal-to-noise (S/N) ratio is a very important performance criterion in nuclear magnetic resonance. One common procedure for improving the S/N ratio is cooling the relevant components to the lowest possible temperature. This is done using cryo probe heads.

To cool cryo probe heads to cryogenic temperatures, cryocoolers with closed gas circuits are generally used, preferably with helium as the fluid and based on Gifford-McMahon, Stirling, or Joule-Thomson processes.

A further cooling method is evaporation of cryogenic fluids within the probe head. Liquid is run through tubes into the probe head, where the thermal load causes it to evaporate.

One feature of any cooling mechanism is a fluid that provides the necessary cooling power for heat dissipation and a thermal contact system that permits the transfer of heat from the component to be cooled to the heat transfer medium=fluid. Such a device is generally termed a heat exchanger.

Irrespective of the characteristics of a cooling system and its auxiliary equipment, an NMR detection system must be operated with as little disturbance as possible and with low operating and maintenance costs.

This invention described below is for cooling components of an NMR detection system with the aim of providing cooling that is as simple and efficient as possible with minimum effort and minimum susceptibility to internal or external disturbances.

Operation of cryocoolers requires a number of items of auxiliary equipment such as compressors, heat sinks, pumps, etc., which makes installation and operation correspondingly costly both in terms of maintenance effort and operating costs. Moreover, the use of rotating or linearly moving components in the equipment leads to transmission of mechanical vibrations into the probe head. Mechanical vibrations that are transmitted to the probe head can have a considerable adverse influence on the NMR signal.

According to the usual prior art, a heat exchanger is supplied through a flow inlet with gaseous or liquid cooling fluid, which exits the heat exchanger through a flow outlet. By means of a contact element with good thermal conduction, a heat exchanger is connected to a heat source, wherein the latter is kept at a desired temperature by dissipating a certain heat load. The heat source can, for example, be an RF resonator or a signal amplifier.

In available systems, the connections between the flow inlet and the flow outlet are constituted as cooling ducts that enable a fluid to flow through and heat to be transferred from a heat source to a cooling fluid in the thermal contact system through structures that may be routed in any way. The cooling conduits can extend helically around a thermal contact system or be spiral and embedded in the thermal contact system. Other embodiments of the cooling ducts are also possible.

Both cooling by evaporation of a fluid cryogen and cooling with cryogenic gases in cryocoolers are used in standard commercial NMR detection systems, although considerable disadvantages are encountered in systems according to the state of the art.

Cooling of cryo probe heads using thermodynamic circulatory processes implemented in cryocoolers is mentioned in DE 103 403 52 A1 and U.S. Pat. No. 5,508,613 A.

Cooling by evaporation of liquid helium or nitrogen within a cryo probe head is described in EP 0 782 005 A1.

Problems with the two-phase flow of a cryogenic fluid in a tube, the associated unstable states, and their effect on thermal transfer properties was discussed by Qi et al. in the *International Journal of Heat and Mass Transfer* (Vol. 50, Issue 25/26, Page 4999-5016).

An NMR RF coil cooled with cryogenic liquid was described by Styles at al. in the *Journal of Magnetic Resonance* (Vol. 60, pages 397-404, 1984). In the configuration described therein, the RF coil is constituted as a tube through which cryogenic fluid flows. Within the coil, evaporation of the fluid and thus cooling of the RF coil is caused by the thermal power of the RF coil. However, such a configuration has considerable disadvantages. The formal design of the coil would be heavily restricted if it had to be constituted as tubes. During evaporation and the associated rapid density change, the flow of the gas phase is greatly accelerated. Because the design does not provide for phase separation, the density change affects the liquid phase and the entire fluid transportation in the form of thermoacoustic vibrations. The cryogenic fluid compressed through the coil under pressure causes vibrations, possibly resulting in susceptibility changes in the coil and mechanical vibrations.

DE 40 13 111 A1 describes a system in which the coil is not in direct contact with the cryogenic fluid but is connected to it through a heat-conducting connection. However, the problem of vibrations persists, despite physical separation of the functions "cooling" and "RF reception", since cryogenic fluid still has to be transported to the heat-conducting connection and the problem of vibrations in the fluid conduits remains.

The use of liquid helium for coil cooling is explicitly stated in JP 2008 241 493 A and WO 03/023433 A1. In both sources, liquid helium is introduced into a heat exchanger through a tube from below. Disturbances in the fluid transportation are thus propagated, undamped into the heat exchanger. Because of the flow inlet from below, gas bubbles occurring in the inflow conduit must flow through the entire liquid bath on entering the heat exchanger, resulting in very unsettled bubbling of the liquid level and causing considerable mechanical vibration. A further weakness is the insufficiently settable or non-settable level of the liquid cryogen and the fluctuating cooling power.

The necessity of thermal decoupling of multiple RF coils is discussed in DE 103 40 352 A1. In the case of the device described there, a separate heat exchanger, through which gaseous fluid flows, is used for each coil, which is incompatible with a compact design. Moreover, in the proposed serial connection gas cooling for NMR detectors the inflow into one heat exchanger is always warmer than the inflow in the preceding heat exchanger. To achieve a temperature at the same level, active closed-loop control has to be used.

SUMMARY OF THE INVENTION

In contrast to the above, the object of this invention is to cool the NMR resonator and various components in an NMR detection device to cryogenic temperatures by means of evaporation of a cryogenic fluid, while reducing the influence of vibrations that can arise due to the cooling and that considerably disturb the NMR signal. Additionally, in particular, the consumption of the cryogenic fluid is to be kept as low as possible.

This object is achieved with a method for cooling an RF resonator during a nuclear magnetic resonance (NMR) measurement on a sample, the RF resonator being disposed within a cryo probe head for reception of radio-frequency (=RF) signals emanating from the sample. The method comprises the steps of:
  a) preparing at least one heat exchanger, the heat exchanger structured to accept a cryogenic fluid, wherein the heat exchanger has at least one contact element that ensures a connection of good thermal conductivity between the cryogenic fluid and the RF resonator, the heat exchanger having a container with an interior volume, the container being structured as a buffer reservoir for the cryogenic fluid, wherein the container has an inflow conduit leading to the interior volume, the inflow conduit structured to accept cryogenic input flow of the cryogenic fluid into the interior volume, the cryogenic input flow having an inflow liquid component and an inflow gaseous component, the container also having an outflow conduit communicating with the interior volume, the outflow conduit structured to accept cryogenic output flow of the cryogenic fluid out of the interior volume, the cryogenic output flow having an outflow liquid component and an outflow gaseous component, wherein the contact element is in thermal contact with the RF resonator and with a liquid volume component of the cryogenic fluid in the container.
  b) adjusting a heat input from the RF resonator into the container such that cryogenic liquid disposed within the container boils without generating substantial vibrations;
  c) continuously flowing cryogenic fluid into and out of the container via the inflow and outflow conduits; and
  d) carrying out the NMR measurement following step b) and during step c).

In a highly preferred embodiment of the inventive method, the inflow conduit has a flow cross-section $Q_Z$ and a circumference $U_Z$ defining a hydraulic diameter $D_{hyd,Z}=4 \cdot Q_Z/U_Z$ and an associated parameter $V_Z=Q_Z \cdot D_{hyd,Z}$, with $V_B>10 \cdot V_Z$, wherein $V_B$ is an interior volume of the container, the outflow conduit having a flow cross-section $Q_A$, wherein $Q_A \geq Q_Z$, wherein the cryogenic input flow $F_1$ into the container is adjusted such that $F_{1L}/F_{1G}>F_{2L}/F_{2G}$, $F_{1L}$ being the inflow liquid component, $F_{1G}$ the inflow gaseous component, $F_{2L}$ the outflow liquid component and $F_{2G}$ the outflow gaseous component.

The advantage of cooling by evaporation of a fluid is that, due to the phase transition from the liquid phase to the gas phase at a constant pressure, maximum heat is extracted from the environment and thus a gas-dependent minimum temperature is achieved. Moreover, the temperature of both phases of the fluid remains constant during the phase transition. Maximum cooling effect at minimum consumption of coolant is achieved when the proportion of liquid cryogen at the outlet of the cooling system is zero.

In evaporation cooling, an extreme density change of the fluid can arise within the cooling system due to the phase transition, possibly causing the fluid to undergo a velocity change in the conduits, which can result in formation of pressure waves or thermoacoustic vibrations that are propagated through the system and can cause mechanical vibrations. Such vibrations should be avoided during NMR measurements. Moreover, 2-phase flows can occur in cryogenic liquids that are closely associated with flow instabilities causing pressure fluctuations.

Depending on the quantity of heat transferred per unit time (=heat flow) and the heat flow per unit area (=heat flow density), changes occur in the boiling state of the liquid, e.g. the heat transfer induces changes from a state of natural or pure convection boiling to a state of nucleate boiling with associated bubble formation within the liquid component. In consequence thereof, periodic pressure fluctuations, wall temperature fluctuations and fluctuations of the transferable heat flow can occur.

Excessive nucleate boiling in transport conduits can lead to entrainment of gas bubbles along the conduit and an increase in pressure loss in the conduit as the proportion of gas rises. On the other hand, nucleate boiling within the container is desirable because a greater heat flow density can be transferred due to the increased transfer of mass by the gas bubbles in the fluid being released from the walls of the conduit, which results in greater cooling power. Through proper adjustment of the heat flow conditions, boiling can be induced while nevertheless avoiding excessive vibrations.

Due to the large interior volume $V_B$ and the gaseous volume components $V_G$ contained therein, any pressure waves in the inflow can be absorbed by compression of the gaseous volume component $V_G$, in particular, because $V_B$ is constituted much larger than the associated parameter $V_Z$. In addition, the liquid volume component $V_L$ in the container serves as a reserve if, for a short time, the inflow of coolant is insufficient for the quantity of heat to be dissipated. By stocking liquid volume $V_L$, the temperature of the heat source can be kept constant. The generous dimensioning of the outflow conduit prevents back-pressure of the outflow out of the container and thus the occurrence of pressure waves in the conduits and mechanical vibrations. Because the contact element is in close thermal contact with the liquid volume component $V_L$, it is ensured that the heat flow is almost completely transferred by boiling while any heat convection by the gaseous component $V_G$ is negligible at the flow velocities of the cryogenic fluid that are typical in an inventive device. In this way, the position and the extent of the heat dissipation is precisely defined and constant over time. Unstable and non-steady flow states in the inflow conduit and the resulting thermoacoustic oscillations that can be expected in the transportation of cryogenic fluids are damped and attenuated in the inventive device and their adverse influence on the NMR signal is minimized. With closed-loop control of the inflow quantity, it is ensured that the state and therefore also the associated advantageous effects remain largely constant in the container.

In an especially preferred embodiment of the inventive device, the container and the inflow conduit are constituted such that $V_B > 20 \cdot V_Z$, preferably $70 \cdot V_Z \leq V_B \leq 150 \cdot V_Z$ applies. These values have proven useful in practice.

In a further advantageous embodiment, a closed-loop control device is provided that controls the device for setting the inflow quantity of the first cryogenic fluid $F_1$ into the container and controls the volume component $V_L$ of liquid cryogenic fluid in the container in relation to the volume component $V_G$ of gaseous cryogenic fluid at a definable value. The ratio between $V_L$ and $V_G$ has a considerable influence on the stability of the cooling and the damping of undesirable vibrations. It is therefore a major advantage to be able to influence this ratio by means of a closed-loop control mechanism.

It is advantageous if, in the embodiment described above, the closed-loop control device controls the inflow quantity of the first cryogenic fluid $F_1$ into the container depending, in particular, on the heat quantity dissipated from the heat sources through the contact element to the heat exchanger in such a way that $V_G > V_L$, preferably $V_G \geq 5 \cdot V_L$. These ratios are especially desirable in relation to the properties of the ratio of $V_G$ to $V_L$ stated above.

Optimally, the closed-loop control device of the embodiments stated above controls the inflow quantity of the first cryogenic fluid $F_1$ into the container such that $F_{2L} \approx 0$. The consumption of cryogenic liquid is thus minimized in a simple manner.

In an especially preferred variant of the embodiments described above, a temperature sensor is provided to measure the temperature of the heat source whose output signal is fed to the closed-loop control device as an input signal for closed-loop control of the inflow quantity of the first cryogenic fluid $F_1$ into the container. In this way, a constant temperature of the heat source can be simply achieved.

Ideally, the above-mentioned embodiments of the inventive method have a level sensor for measurement of the current level of the volume component $V_L$ of liquid cryogenic fluid in the container. Using the measured value from this level sensor simplifies closed-loop control of the ratio of $V_G$ to $V_L$.

In an optimized variant of the last embodiment described above, the fluid inflow is increased by the device for setting the inflow quantity of the first cryogenic fluid $F_1$ into the container as soon as it falls below a settable level and this is signaled. In this way, the inflow quantity of the first cryogenic fluid $F_1$ does not have to be set and monitored manually.

In a further variant of the penultimate embodiment stated above, the fluid inflow is blocked by the device for setting the inflow quantity of the first cryogenic fluid $F_1$ into the container when it reaches or exceeds a maximum liquid level and when it reaches or falls below a minimum liquid level, the fluid inflow is opened again. This avoids the liquid level having to be monitored and set manually and considerably simplifies operation of the inventive device.

A preferred embodiment has closed-loop temperature control of the heat source by means of a closed-loop control device and a heater that is thermally well connected to the heat source. In this case, the controlled temperature is necessarily always higher than the temperature that is achieved without a heater. The temperature can thus be controlled at a constant value in a simple but effective way in response to an increase in the heat load at the heat source.

In an especially preferred embodiment, the heat source is directly connected to the lower cover of the container belonging to the heat exchanger, wherein this lower cover performs the function of the contact element and is therefore preferably made of a material with the lowest possible thermal resistance and having a wall thickness that is as small as possible to ensure the best possible thermal connection between the heat source and the liquid fluid $V_L$. This is especially advantageous because the material for a separate contact element is avoided.

A further preferred embodiment has a heat source that is directly connected to the upper cover of the container belonging to the heat exchanger, wherein the upper and the side covers of this container perform the function of the contact element and therefore preferably consist of a material with the lowest possible thermal resistance and having a wall thickness that is as large as possible so that the best possible thermal connection between the heat source and the liquid fluid $V_L$ is thereby ensured. As in the embodiment above, a separate contact element can also be avoided.

In a further preferred embodiment of the inventive method, the heat source is directly connected to the upper cover of the container belonging to the heat exchanger and this container also accommodates, in its interior, a contact element with good thermal conduction that is permanently connected to the upper cover of the container and is immersed in the liquid fluid $V_L$, wherein the contact element is preferably arranged directly below the heat source and the upper cover preferably has the smallest possible wall thickness to provide for the best possible thermal connection between the heat source and the liquid fluid $V_L$. In this embodiment, the contact surface between the liquid component of the fluid $V_L$ and the contact element is especially large, which advantageously reduces bubbling in the liquid phase.

A further advantageous embodiment has a heat exchanger with a contact element that protrudes from the top of the heat exchanger, is attached to the upper cover of the heat exchanger and has a good thermal connection to the heat source, wherein the lower part of the contact element is immersed in the liquid fluid $V_L$, so that the best possible thermal connection between the heat source and the liquid fluid $V_L$ is thereby ensured. This variant can prove advantageous because the heat source has no direct contact with the container of the heat exchanger and heating of the latter can be minimized.

In an alternative embodiment, the heat source is attached above the fluid level to the side wall of the container belonging to the heat exchanger, wherein this wall performs the function of the contact element and is therefore preferably made from a material with the lowest possible thermal resistance and with a wall thickness that is as large as possible.

In a similar alternative embodiment, the heat source is attached below the fluid level to the side wall of the container belonging to the heat exchanger, wherein the wall performs the function of the contact element and is therefore preferably made of a material with the lowest possible thermal resistance and a wall thickness that is as small as possible.

Optimally, the contact element is connected to a thermally insulating fastening element wherein this fastening element is constituted such that the upper part of the contact element is separated from the liquid fluid $V_L$ and only the lower part is immersed in the fluid $V_L$ so that, in this way, the temperature of the heat source is less influenced by changes of the level of $V_L$. This embodiment minimizes the problem of temperature fluctuations of the heat source in a surprisingly simple manner.

A variant of the last embodiment stated above has a heat exchanger with two contact elements. In this way, two heat sources can advantageously be cooled using one heat exchanger.

An especially preferred embodiment of the inventive device has multiple, serially connected reservoirs, wherein the outflow of the i-th reservoir constitutes the inflow of the (i+1)-th reservoir. Moreover, at least the last reservoir in the series is equipped with temperature control/level control. A serial connection is especially advantageous because it enables multiple heat sources to be cooled without the need for a separate cooling device for each of them.

Further advantages of the invention result from the description and the drawing. Moreover, according to the invention, the characteristics stated above and further below can be used singly or in any combination. The embodiments shown and described are not intended to be an exhaustive list but are examples used to explain the invention.

DESCRIPTION OF THE PREFERRED EMBODIMENT

The inventive method is intended to cool the RF resonator and various components of an NMR detection device to cryogenic temperatures by means of evaporation of a cryogenic fluid, while largely avoiding the influence of vibration that could arise due to excessive boiling of the cryogenic liquid during the cooling operation, which would interfere with the NMR signal. The inventive method also minimizes consumption of the cryogenic fluid.

Figure 1:
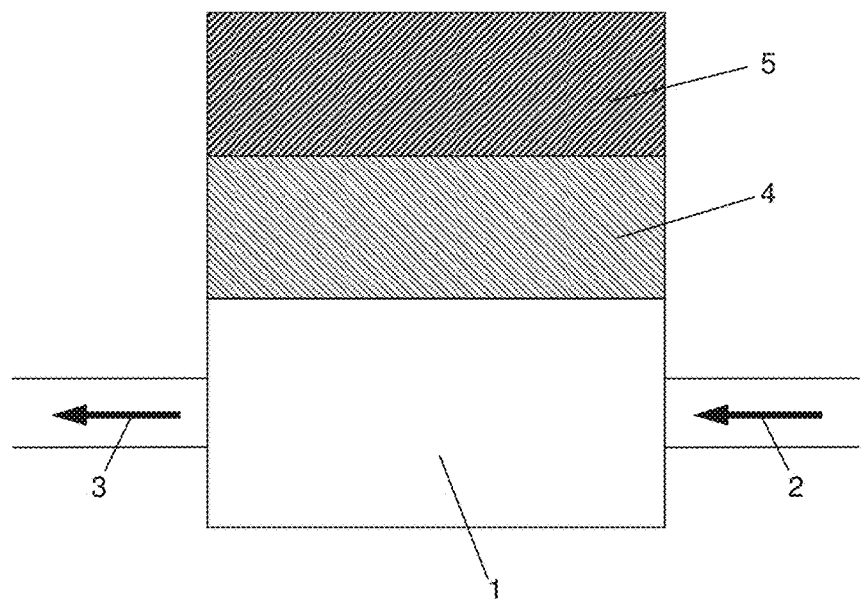
FIG. 1 Method of functioning of the heat exchanger.

FIG. 1 shows a heat exchanger according to the prior art with a heat exchanger 1 into which an inflow 2 of coolant flows and from which an outflow 3 of coolant exits. A heat source 5 is connected thermally conductively and permanently to a contact element 4 made of material with good thermal conduction that ensures heat transfer from the heat source to the heat exchanger.

Figure 2:
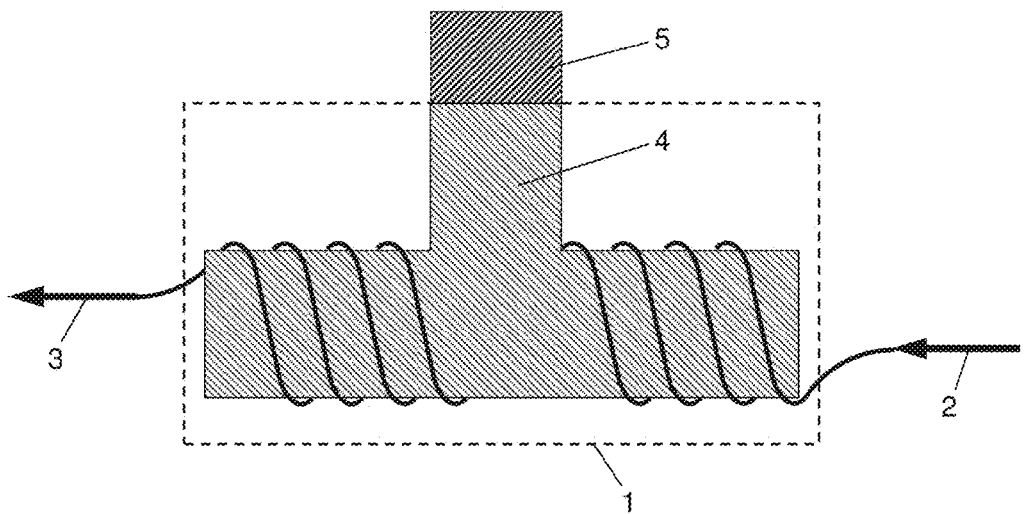
FIG. 2 Prior art: heat exchanger with helically wound cooling conduit.

A further embodiment of the prior art is shown in FIG. 2. Here, the contact element 4 with a T shape is located in the interior of the heat exchanger 1 while the coolant is routed helically around the contact element 4.

Figure 3:
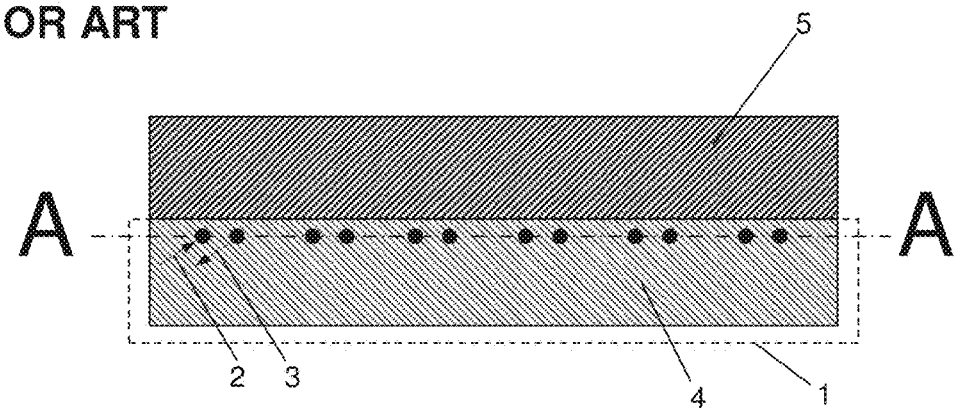
FIG. 3 Prior art: heat exchanger with two parallel and spirally wound cooling conduits.
Figure 3:
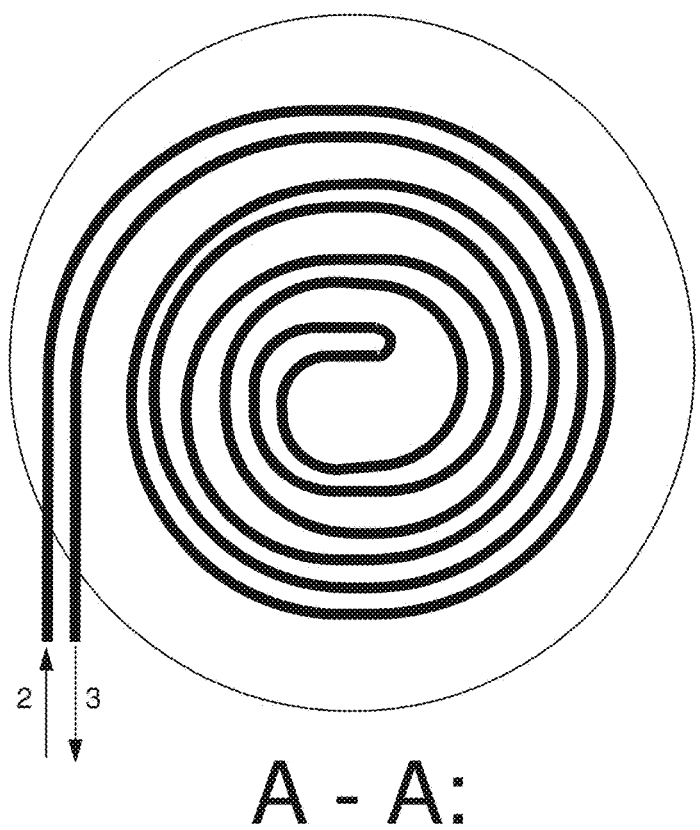

FIG. 3 shows a different variant according to the prior art, wherein the coolant is routed spirally and horizontally embedded between the heat source 5 and the contact element 4.

Figure 4:
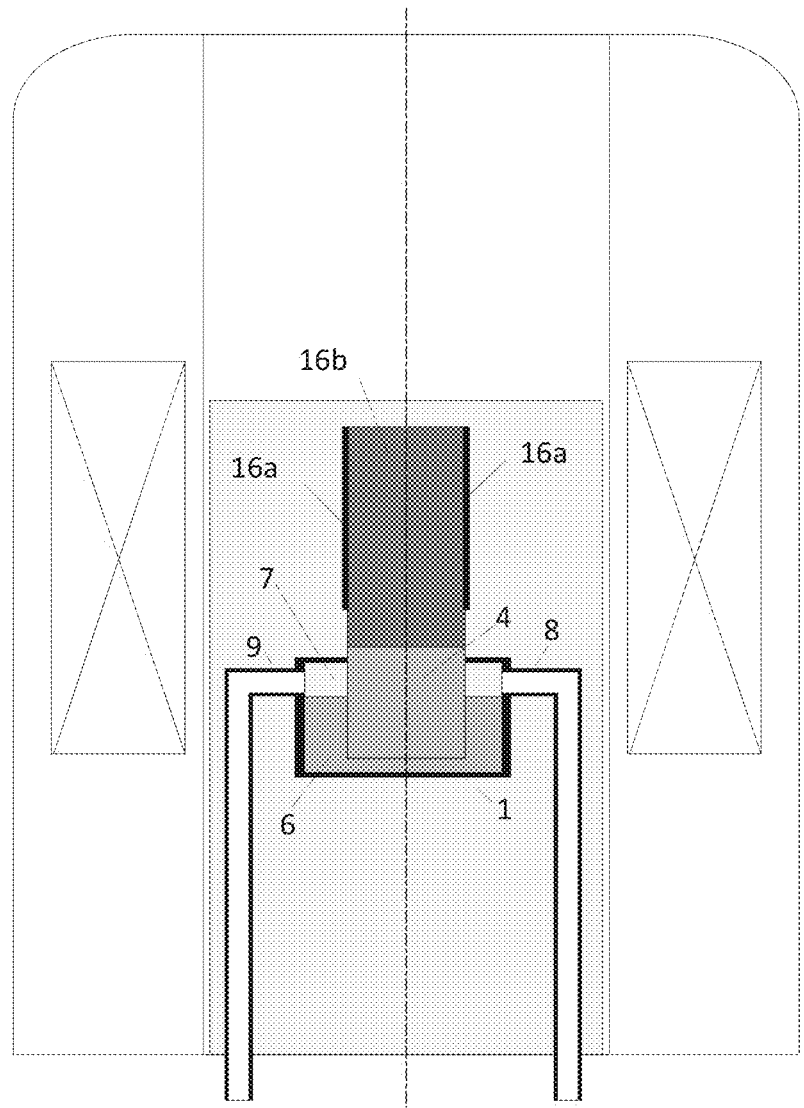
FIG. 4 A schematic illustration of the inventive heat exchanger in an NMR system for carrying out the inventive method.

FIG. 4 schematically illustrates an apparatus suitable for carrying out the inventive method. The RF resonator 16a is supported by a mounting element 16b within a static magnetic field. A contact element 4 having good thermal conduction properties is in good thermal connection to both the RF resonator 16a as well as a liquid volume component 6 of cryogenic fluid disposed within a heat exchanger container 1. A gaseous volume component 7 of the cryogenic fluid is illustrated in the upper portion of the container 1. The container 1 has an inflow conduit 8 for introducing inflow fluid $F_1$ into the container 1 and an outflow conduit 9 through which outflow fluid $F_2$ exits the container 1.

Figure 5:
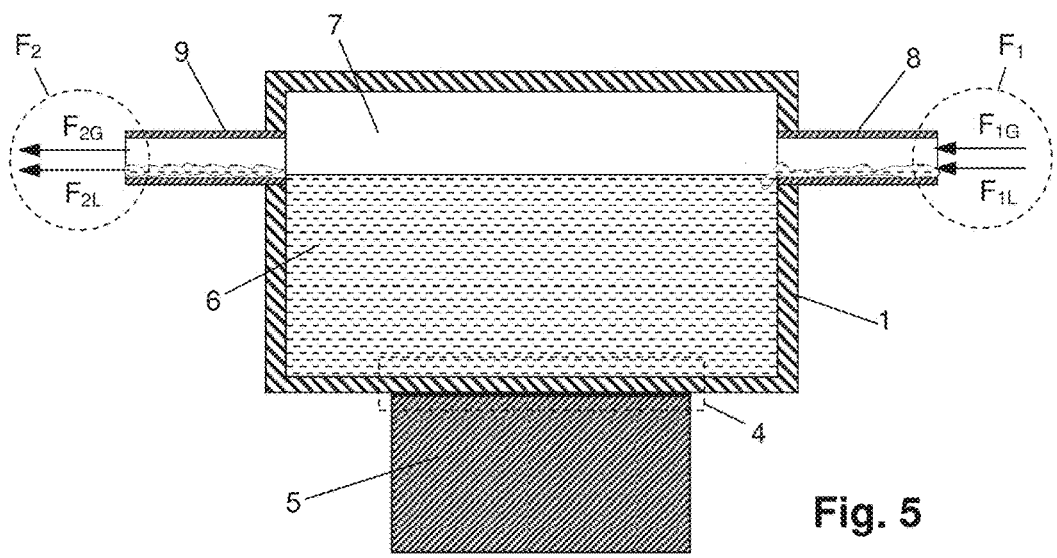
FIG. 5 Inventive heat exchanger in which the heat source is connected to the lower wall of the container with good thermal conduction.

The basic structure of a cooling device structured for use in the inventive method is shown in FIG. 5. The heat exchanger 1 is implemented as a container having an interior space with a volume component of liquid fluid $V_L$ 6 and a volume component of gaseous fluid $V_L$ 7, wherein the spaces of $V_L$ 6 and $V_G$ 7 are connected to an inflow conduit 8 and an outflow conduit 9.

The inflow $F_1$ 2 of cryogenic fluid enters the heat exchanger 1 through an inflow conduit 8. The inflow $F_1$ 2 of the cryogenic fluid has a liquid component $F_{1L}$ and a gaseous component $F_{1G}$.

If the heat source 5 is heated, the heat flow emanating from it is directly carried through the thin wall of the heat exchanger 1 to the volume component of liquid cryogen $V_L$ 6 in the interior of the heat exchanger 1. Here, a certain quantity of the liquid component $V_L$ 6 evaporates to form the gaseous phase, thus reducing that liquid component and increasing the gaseous component $V_G$ 7.

The extent of gas bubble formation in the liquid volume component $V_L$ 6 can be determined according to the boiling curve of the cryogenic fluid by adapting the surface available for heat transfer to the heat flow to be transferred. By appropriately dimensioning the contact surface between thermal contact element 4 and the liquid component $V_L$ 6, the boiling state in the steady-state condition and therefore the intensity of the gas bubble formation are defined. In this way, excessive nucleate boiling of the fluid in $V_L$ 6 and therefore the occurrence of vibrations can already be avoided in the design of an inventive cooling device.

In the gas space $V_G$ 7 in the interior of the heat exchanger 1, gases arising from evaporation from the liquid component $V_L$ 6 collect, together with the gaseous component $F_{1G}$ brought in by the inflow $F_1$ 2. In the interior of the heat exchanger 1, there is a defined separation between the gaseous phase and the liquid phase at any moment in time.

The outflow $F_2$ 3 of the cryogenic fluid exits the heat exchanger 1 through the outflow conduit 9. The outflow $F_2$ 3 of the cryogenic fluid has a liquid component $F_{2L}$ and a gaseous component $F_{2G}$. The gaseous component $F_{2G}$ of the fluid exiting in $F_2$ 3 is composed of the gaseous component $F_{1G}$ of the entering fluid plus the quantity evaporated from the liquid component $V_L$ 6 in the interior of the heat exchanger 1. The outflow conduit 9 is dimensioned in relation to the inflow conduit 8 such that the gas quantity $F_{2G}$ can flow out without a pressure increase occurring in the interior of the heat exchanger.

With respect to the quantity of liquid component $F_{1L}$ transported during continuous operation in the steady state, the following operating states are conceivable:

i) exactly the same amount of liquid is transferred into the heat exchanger 1 as has to evaporate to cool the heat source 5.

ii) more liquid is transferred into the heat exchanger 1 than has to evaporate to cool the heat source 5 iii) less liquid is transferred into the heat exchanger 1 than has to evaporate to cool the heat source 5

Comments about the above three states:

i) In an ideal ratio between the inflowing liquid component $F_{1L}$ and the evaporated liquid quantity, the gaseous component $F_{2G}$ in the outflow conduit $F_2$ 9 is 100%, that is, no excess liquid flows out of the interior of the heat exchanger 1. The volume components of liquid $V_L$ 6 and gas $V_G$ 7 in the interior of the heat exchanger 1 remain constant over time during continuous operation in the steady state.

ii) If more liquid $F_{1L}$ enters through the inflow $F_1$ 2 than has to be evaporated by the heat flow from heat source 5 into the liquid volume component $V_L$ 6 in the interior of the heat exchanger 1, the volume components of liquid $V_L$ 6 and gas $V_G$ 7 remain constant over time in the interior of the heat exchanger 1, as in operating state i), because not only gas but also liquid flows out through the outflow opening 9, serving as an overflow. In this case, the outflow $F_2$ flowing out through outflow conduit 9 contains not only the gaseous component $F_{2G}$ but also a liquid component $F_{2L}$. The liquid component $F_{2L}$ of the fluid exiting in $F_2$ 3 is then composed of the liquid component $F_{1L}$ of the entering fluid minus the quantity evaporated in $V_L$ 6. This operating state is conceivable if the heat flow is reduced or the quantity transported in the inflow $F_1$ 2 is increased.

iii) If less liquid $F_{1L}$ enters through the inflow $F_1$ 2 than has to be evaporated by the heat flow from heat source 5 into the liquid volume component $V_L$ 6 in the interior of the heat exchanger 1, outflow $F_2$ 3 contains 100% gaseous component $F_{2G}$. The liquid component $V_L$ 6 inside the heat exchanger 1 is then reduced until no liquid component is present. As long as a liquid component $V_L$ 6 is present, the heat flow can still be dissipated. This operating state is conceivable if the heat flow is increased or the quantity transported in the inflow $F_1$ 2 is reduced or interrupted. The liquid volume component $V_L$ 6 acts as a sort of buffer so that disturbances in the form of non-constant transported quantity are not passed on to the heat source in the fluid transfer. Moreover, thanks to this thermal buffering effect, temporary increases in the heat input are compensated for without a need for active closed-loop control.

In addition to the liquid component, the gaseous volume component $V_G$ 7 in the heat exchanger 1 is also used as a buffer or damping element for vibrations.

An approximately ideal thermal insulation is technically extremely costly and unsuitable for a system whose main purpose is economic viability and low operating costs. For that reason, heat input from the environment or from the conduit walls must be expected, which is also often described as thermal loss. For this reason, the gas phase occurs in the conduit for cryogenic liquids and therefore also formation of a 2-phase flow comprising gaseous and liquid components. The gaseous components may be present in the flow as dispersed bubbles but they may also occupy the entire cross-section of the outflow conduit 9 in some sections. The gas phase and liquid phase can move at different velocities and absorb heat from the walls to different degrees. As a consequence, the transferable heat flow varies along a conduit, which results in poorly defined local heat transfer, especially in cryogenic tube heat exchangers according to prior art. Unstable and non-steady flow states can occur in the inflow conduit 8 that are propagated through the conduit system as thermoacoustic oscillations until they are evaporated due to wall friction or due to suitable design measures.

Quantitative analysis of such effects would be extremely costly in any case. It is therefore expedient to reduce any interfering consequences of these effects by providing design elements for this purpose. Such a design element is the gaseous volume component $V_G$ 7 in the interior of the heat exchanger 1 or the separation of the gaseous component $V_G$ 7 from the liquid component $V_L$ 6. By positioning of the heat source and adaptation of the wall thickness, it is ensured that the heat dissipation from the heat source 5 is always performed through the liquid component $V_L$ 6. In this way, the heat flow is always constantly transferred by boiling. Time-variable heat transfer by convection may also occur in the gaseous component $V_G$ 7 in the upper part of the heat exchanger 1 but is negligible in comparison to the heat transfer due to boiling in the liquid component $V_L$ 6 at the flow velocities that would prevail in a cooling device for coil resonators in NMR detection devices. Therefore, in the inventive cooling device, the position and the extent of the heat dissipation are precisely defined and constant over time because the evaporation location, the heat transfer contact surfaces, and the liquid volume component $V_L$ 6 are invariable over time.

Pressure variations that enter the heat exchanger 1 from the conduits cause a minimum compression of the volume in the space, which is large compared to the incoming volume of gas. Further, by rapid venting to the atmosphere through the outflow conduit 9, a still larger buffer is available if a pressure variation in the outflow conduit 9 persists.

Influence of the environment on the state of the liquid component is limited solely to the ambient pressure whose variation does influence the evaporation temperature but negligibly compared with the temperature change in the RF pulses in the resonator 16a. To provide compensation for this temperature change, an embodiment of the inventive device is conceivable in which the pressure inside the heat exchanger 1 is kept constant by a closed-loop pressure control device.

The heat transfer from the thermal contact element 4 to the liquid volume component $V_L$ 6 is considerably better than to the gaseous volume component $V_G$ 7. It is important in this respect that the heat flow is mainly dissipated to the liquid volume component $V_L$ 6 and therefore special attention should be paid to the best possible transportation of the heat quantity from the heat source 5 to the liquid volume component $V_L$ 6.

Figure 6:
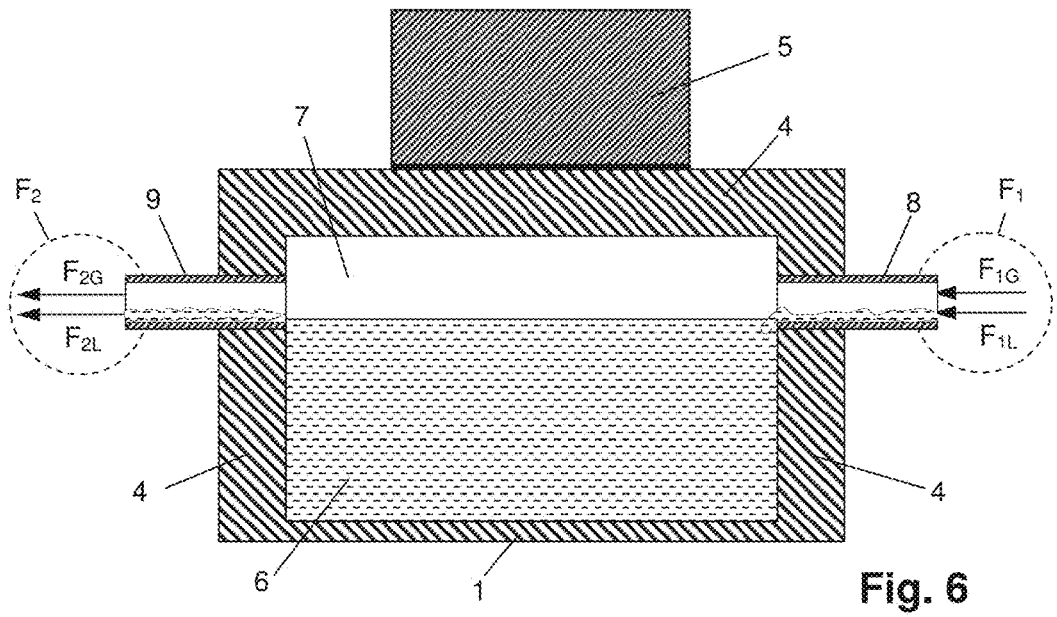
FIG. 6 Inventive heat exchanger in which the heat source is connected to the upper wall of the container with good thermal conduction.

FIG. 6 shows a preferred embodiment of the inventive cooling device. Here, the heat source 5 contacts the upper wall of the heat exchanger 1 with good thermal conduction. In this embodiment, the upper wall and the side walls of the heat exchanger 1 perform the function of a thermal contact element 4 so that a good thermal connection between the heat source 5 and the liquid volume component $V_L$ 6 in the interior of the heat exchanger 1 is ensured.

Figure 7:
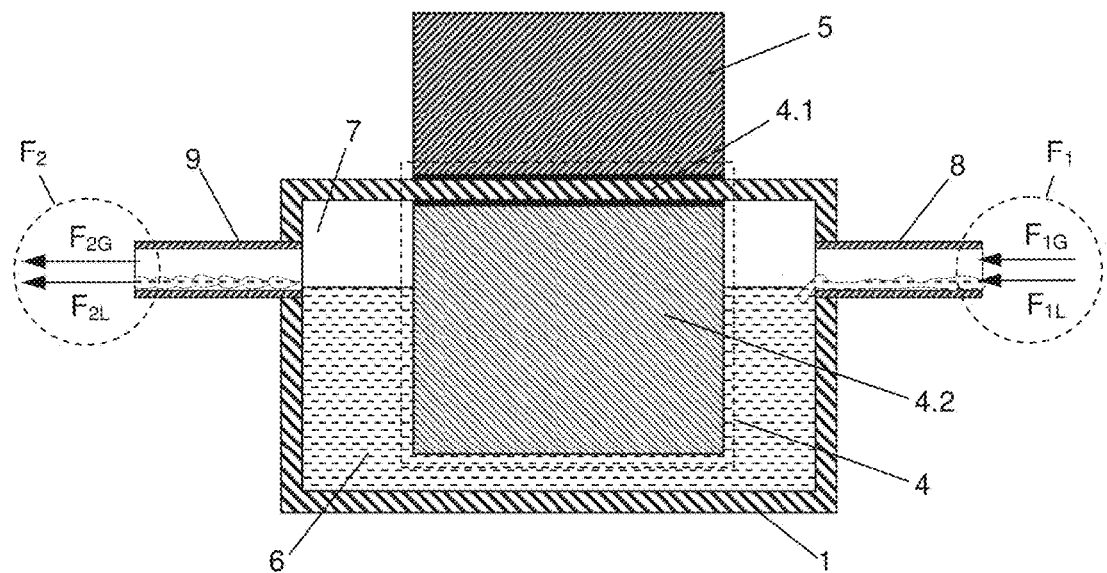
FIG. 7 Inventive heat exchanger as in FIG. 6, in which a subcomponent of the contact element is also present that is immersed in the liquid volume component.
Figure 8:
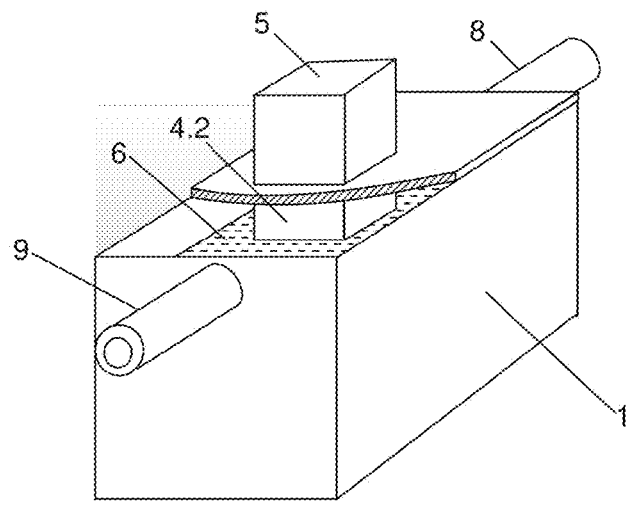
FIG. 8 Inventive heat exchanger as in FIG. 7, in a 3D view and with partially removed cover.

FIG. 7 shows a further advantageous embodiment of the inventive cooling device in which the heat source 5 is connected with good thermal conduction to the upper wall of the container 1. A subcomponent of the contact element 4.1 is connected to the outer side of the container 1 with good thermal conduction with the heat source 5. A further subcomponent of the contact element 4.2 is in close thermal contact with the liquid volume component $V_L$ 6 in the interior of the container 1. In this embodiment, the heat flow can be routed directly to the liquid volume component $V_L$ 6, which results in low thermal resistance. The subcomponent 4.2 in the interior of the container 1 is disposed such that the gaseous volume component $V_G$ 7 is always connected to the inflow conduit 8 and the outflow conduit 9, as is shown in the three-dimensional, partly cut-away view in FIG. 8.

Figure 9:
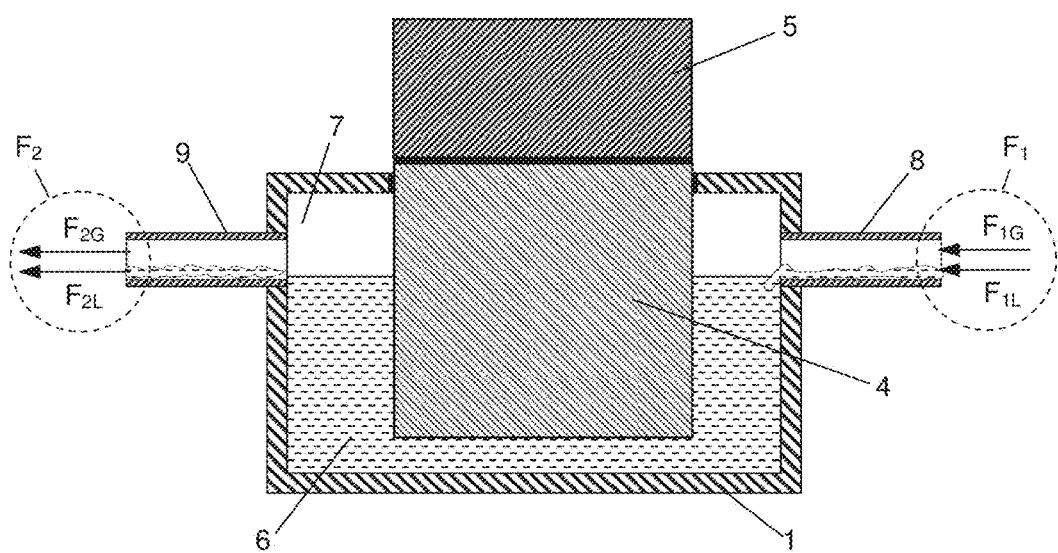
FIG. 9 Inventive heat exchanger similar to FIG. 7 but in which the heat source is directly connected to the contact element. The contact element is immersed in the liquid volume component.

FIG. 9 shows an advantageous variant of the embodiment shown in FIG. 7. Here, the contact element 4 is no longer connected via the wall of the container 1 but directly with good thermal conduction to the heat source 5 and the liquid volume component $V_L$ 6. This embodiment causes a further reduction of the thermal resistance between heat source 5 and the liquid volume component $V_L$ 6. The wall of the container 1 is connected to the contact element 4 on the side and is now used only for mechanical fixture. The wall of the container no longer has any function with regard to the heat transfer between the heat source 5 and liquid volume component $V_L$ 6.

In an especially advantageous embodiment, the inventive method utilizes a closed-loop control device for adjusting the fluid inflow $F_1$ 2. The aim of such a measure is to minimize the fluid consumption by adjusting the inflow $F_1$ 2 depending on the liquid volume component $V_L$ 6 in such a way that the residual quantity of liquid $F_{2F}$ present in the outflow $F_2$ 3 is extremely small or equal to zero.

Figure 10:
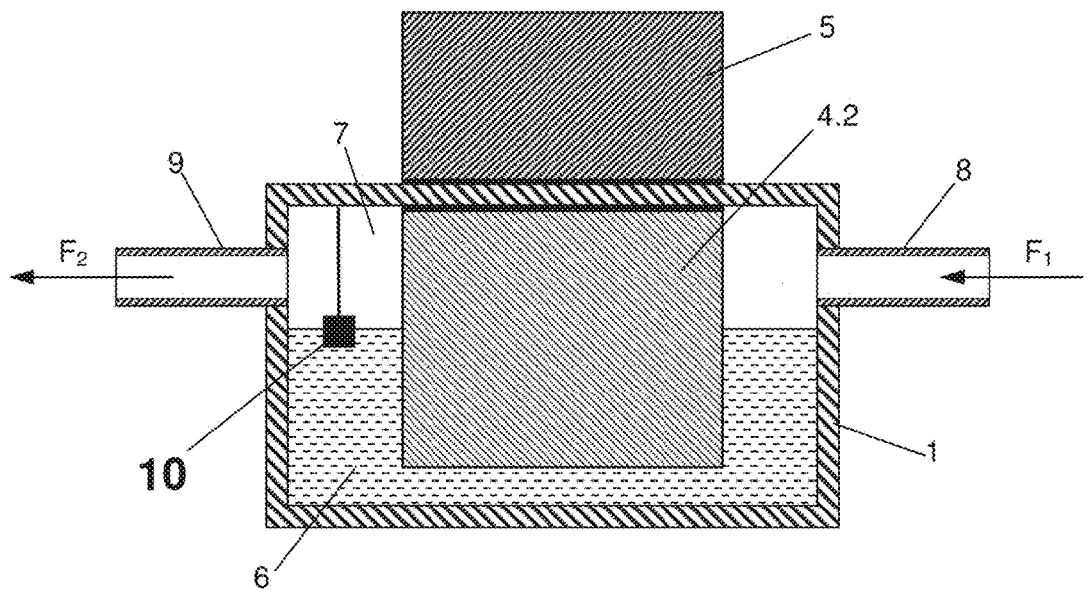
FIG. 10 Inventive heat exchanger according to FIG. 7 with a sensor that responds on reaching the maximum level of $V_L$.

One way of reducing the residual quantity of liquid $F_{2F}$ present in the outflow $F_2$ 3 is to define a maximum tolerable level of the liquid volume component $V_L$ 6 in the container 1, which is defined by the installation position of a sensor 10 (see FIG. 10) and is below the level of the outflow opening 9.

Figure 11:
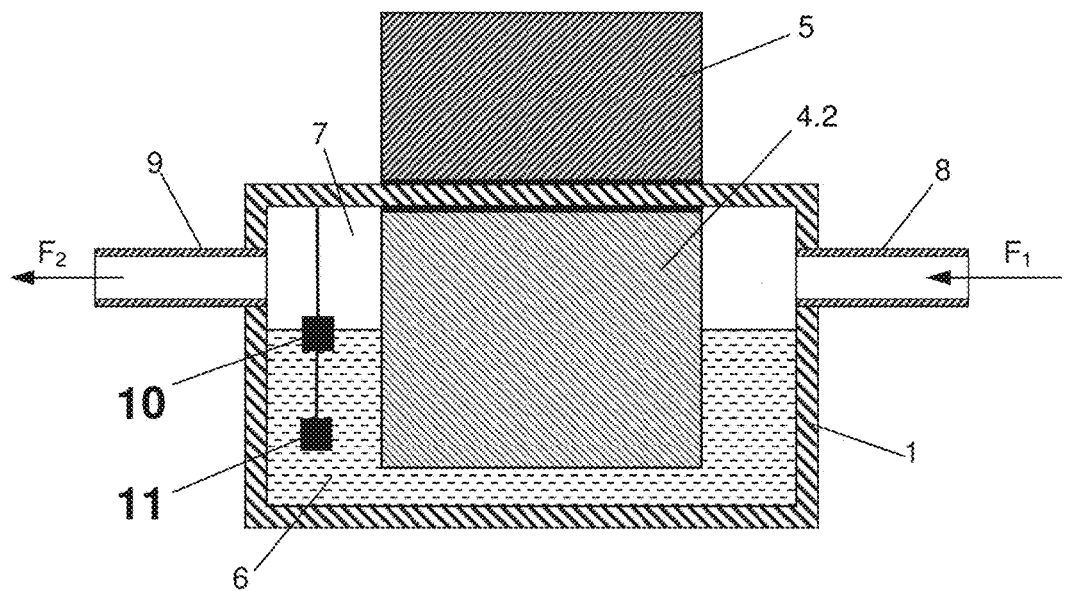
FIG. 11 Inventive heat exchanger according to FIG. 7 with two sensors wherein one sensor responds on reaching the maximum level and one sensor responds on reaching the minimum level of $V_L$.

To be able to additionally measure the minimum level, in a specially preferred embodiment (FIG. 11), besides the sensor 10 for detecting a defined maximum tolerated level, a sensor 11 for detecting a defined minimum tolerated level in the heat exchanger 1 is also present.

Figure 12:
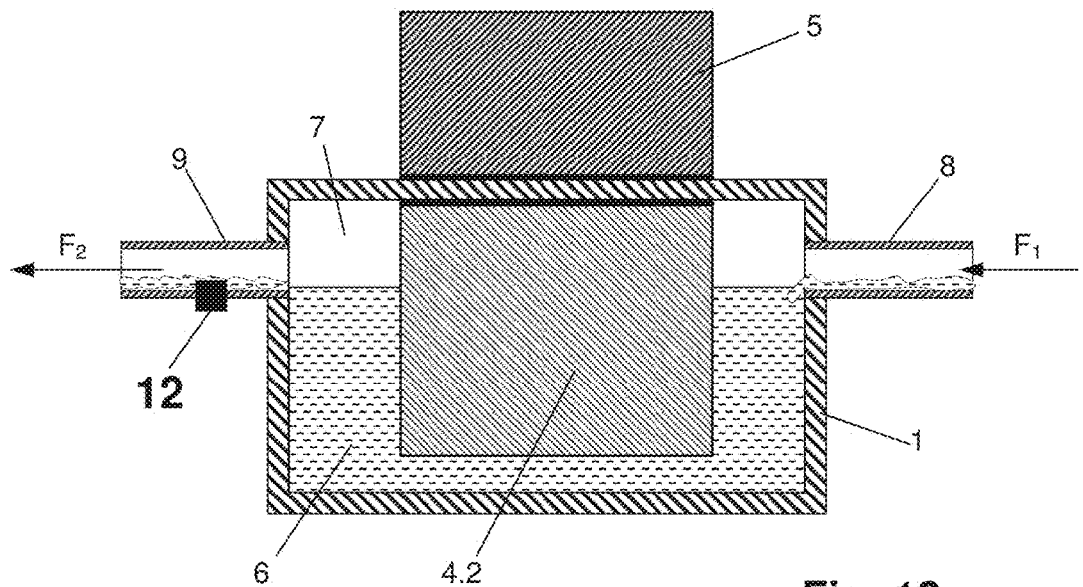
FIG. 12 Inventive heat exchanger according to FIG. 7 with one sensor for detection of the liquid component $F_{2L}$ in the outflow conduit.

One alternative embodiment is shown in FIG. 12. This variant is based on the embodiment described in FIG. 7 that is augmented by a sensor 12 in the outflow opening 9. This sensor 12 detects whether a liquid component $F_{2L}$ is present in the outflow $F_2$ 3. If the liquid component $F_{2F}$ is greater than zero, the closed-loop control device reduces the inflow $F_1$ 2.

Figure 13:
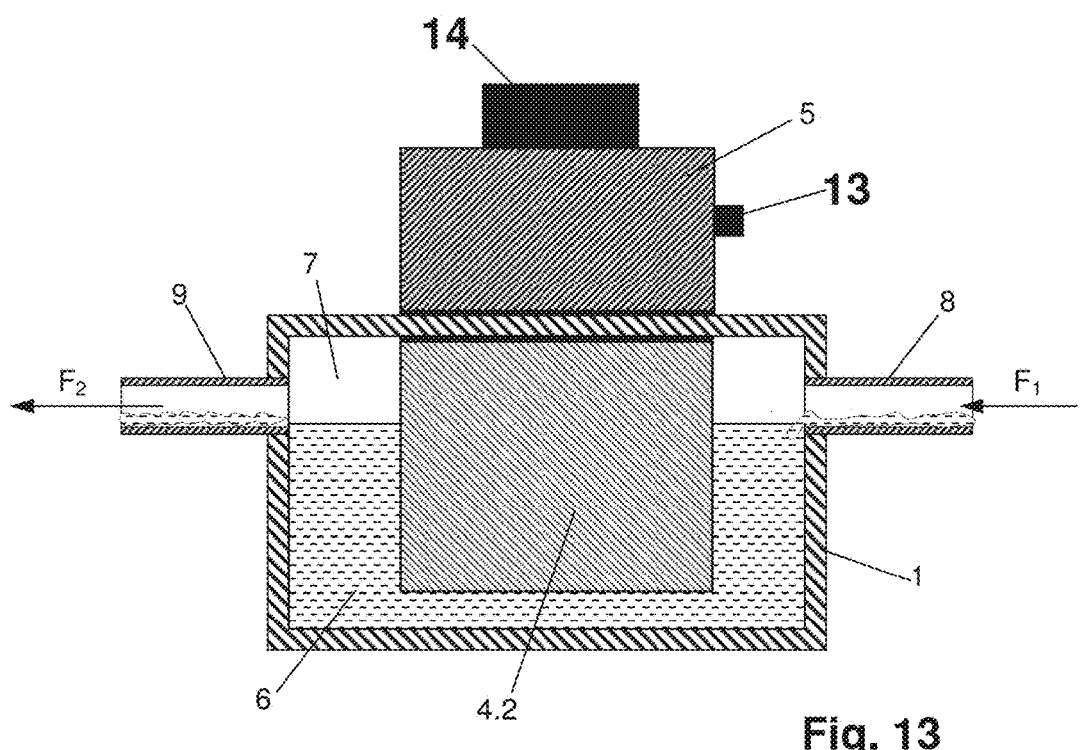
FIG. 13 Inventive heat exchanger with a temperature sensor and controllable heater, both thermally connected to the heat source.

A further possible embodiment is shown in FIG. 13. Here, a sensor 13 and a heater 14 are located at the heat source 5. The sensor 13 measures the temperature at the heat source 5. If the measured temperature deviates from a defined target value, the closed-loop control device compensates for the temperature change by increasing or reducing the heating power on the heater 14.

The closed-loop control device, the sensor 13, and the heater 14 can be configured such that the same heat flow is always transferred in the heat exchanger 1 and the same quantity of liquid component $V_L$ 6 evaporates. This variant can be especially advantageously combined with the embodiments according to FIG. 10, FIG. 11, and FIG. 12.

Figure 14:
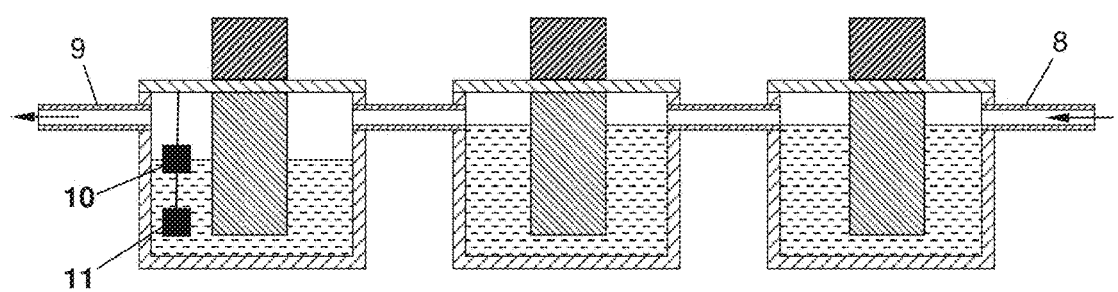
FIG. 14 Multiple inventive heat exchangers disposed side by side that are serially interconnected through conduits transporting fluid, wherein level sensors are only contained in the last heat exchanger.

In FIG. 14, multiple inventive heat exchangers are serially disposed side by side and each connected through fluid bearing conduits. The level of the liquid component $V_L$ 6 in each heat exchanger 1 of the serial configuration is at a maximum so that enough liquid component $F_{2L}$ is present in the outflow $F_2$ 3 of each heat exchanger to ensure sufficient liquid component $V_L$ 6 in the following heat exchangers. The last heat exchanger in the flow direction of a serial configuration can have a closed-loop control device, for example, as in FIG. 10, FIG. 11, FIG. 12 or a closed-loop control device derived from any of these, to minimize the fluid consumption. In the embodiment according to FIG. 14, for example, the last heat exchanger in the flow direction contains a sensor 10 for detection of a maximum tolerated level of $V_L$ 6 and a sensor 11 for detection of a minimum tolerated level of $V_L$ 6 based on the variant in FIG. 11.

Figure 15:
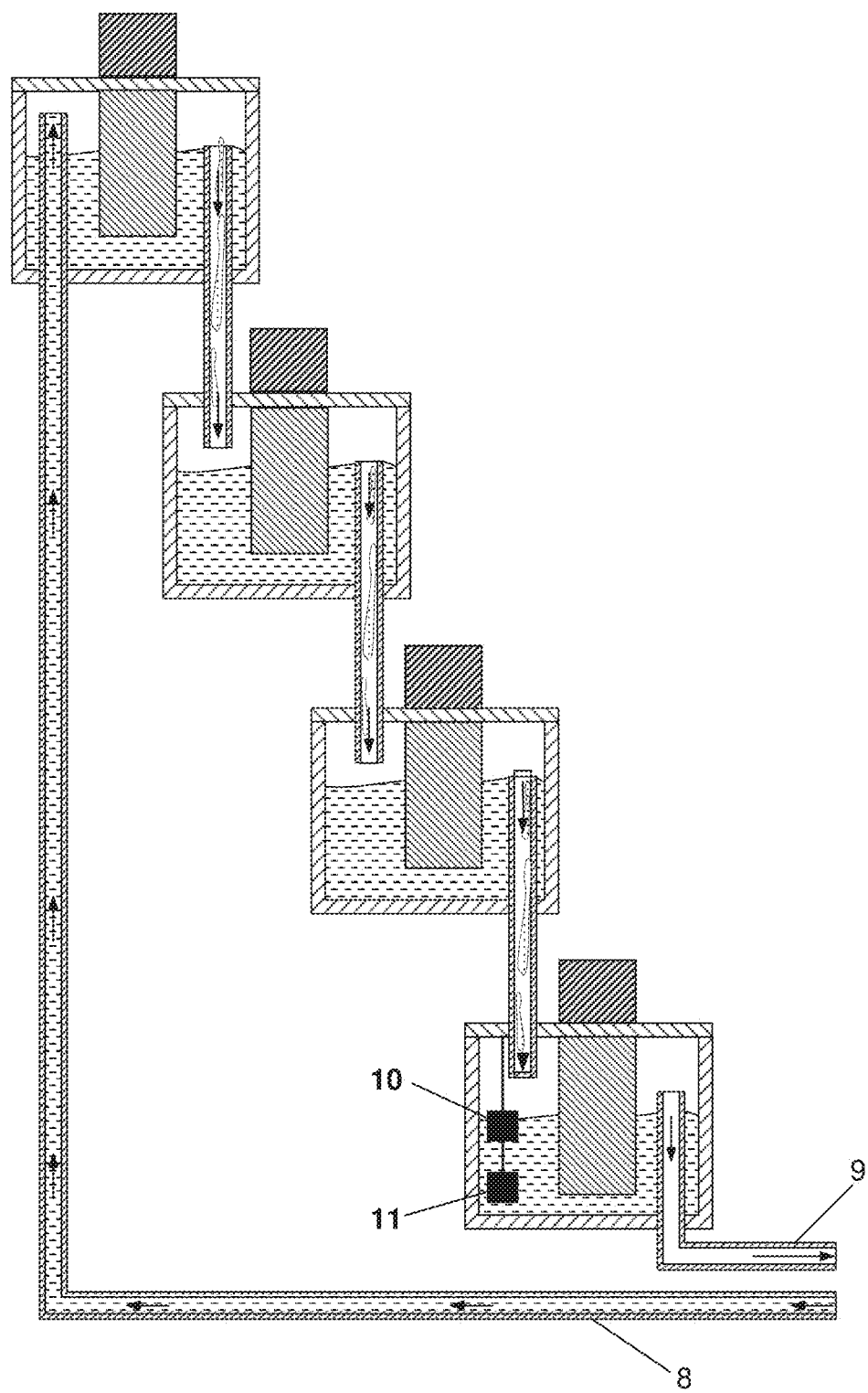
FIG. 15 As FIG. 14, but with heat exchangers disposed one below the other.

A further serial configuration is shown in FIG. 15 in which multiple heat exchangers disposed one above the other are interconnected by conduits carrying fluid and are equipped with sensors 10 and 11 for detection of a maximum or minimum level of $V_L$ 6 in the last heat exchanger of the configuration.

Any combinations of serial and parallel configurations are conceivable depending on the space available in an application.

Figure 16:
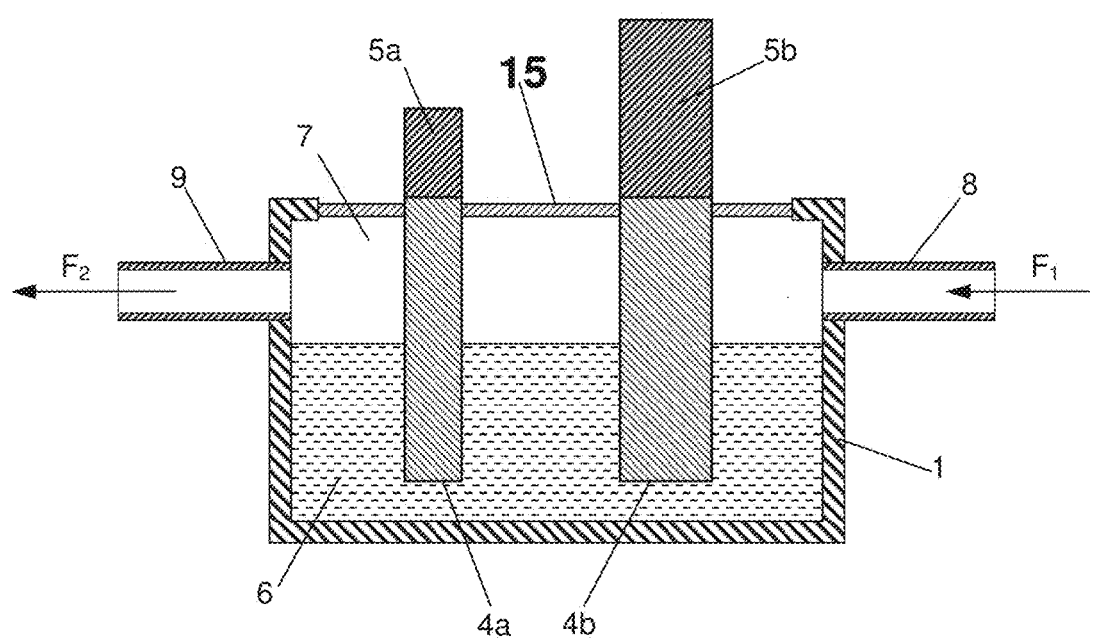
FIG. 16 Heat exchanger with two contact elements that are attached to a thermally insulating element.

An especially advantageous embodiment is shown in FIG. 16. Here, two separate heat sources 5a and 5b are connected by separate contact elements 4a and 4b with good thermal conduction. Both are immersed in a heat exchanger 1 in the same liquid component $V_L$ 6. The two contact elements 4a and 4b with good thermal conduction are connected by thermally insulating fastening elements 15a and 15b with the wall of the heat exchanger 1.

Figure 17:
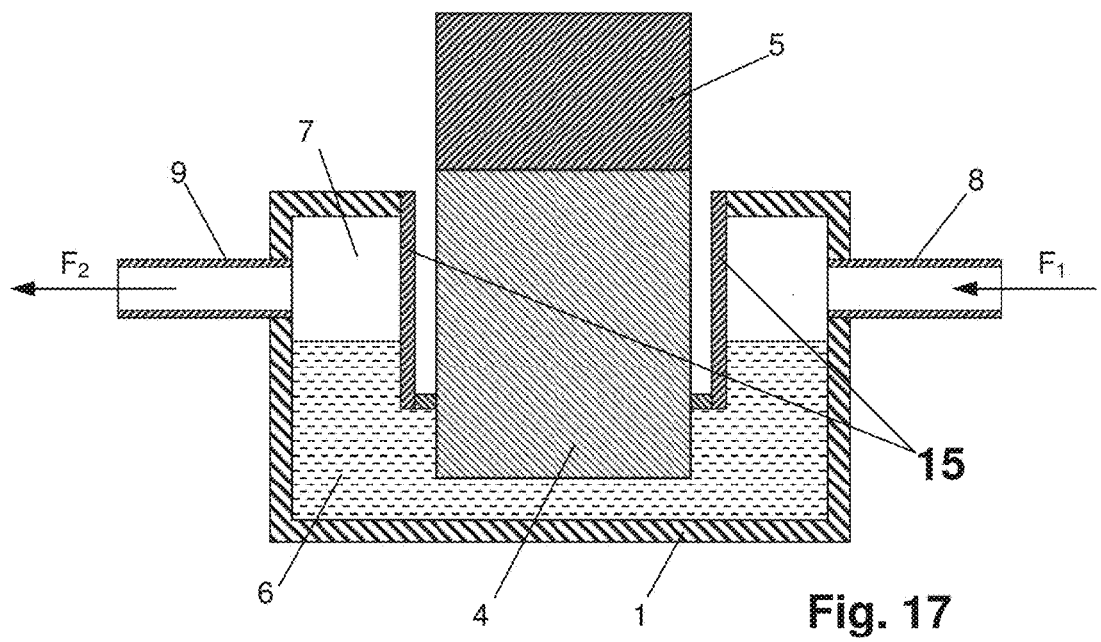
FIG. 17 Heat exchanger with a contact element that is attached to a thermally insulating element and this element is constituted such that the cooling of the contact element is performed as independently as possible from the level of the liquid volume component.

FIG. 17 shows an embodiment of the inventive method using a device with only one thermally insulating fastening element 15. The fastening element 15 is fastened to the wall of the heat exchanger 1 and is then brought into the interior space of the heat exchanger 1 as meander-shaped continuation of the heat exchanger wall and connected there with the contact elements 4a and 4b. The location of the contacting of the insulating fastening element 15 and contact element 4 is below the inflow conduit 8 and below the outflow conduit 9 so that the level of the liquid component $V_L$ 6 is always above the contacting location. In this configuration, the contact surface between the liquid component $V_L$ 6 and contact element 4 and the distance between heat source 5 and contact surface remain constant when the level of $V_L$ 6 changes.

Figure 18:
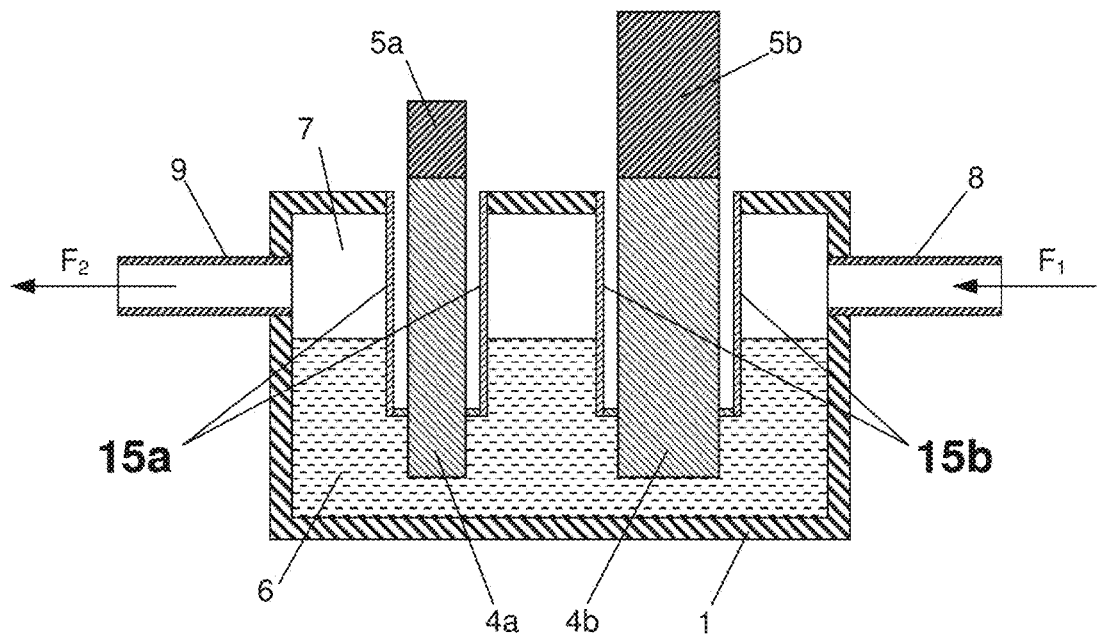
FIG. 18 As FIG. 17, but with two contact elements that are attached to two insulating elements.

FIG. 18 shows a combination of the embodiments according to FIG. 16 and FIG. 17. In this variant, two thermally decoupled heat sources 5a and 5b are connected with the same liquid component $V_L$ 6 through two separate contact elements 4a and 4b and fastened to the wall of the heat exchanger 1 using two separate thermally insulating fastening elements 15a and 15b. This variant permits simultaneous cooling of two heat sources 5a and 5b with simultaneous thermal decoupling and decoupling from the level of the liquid component $V_L$ 6.

Figure 19:
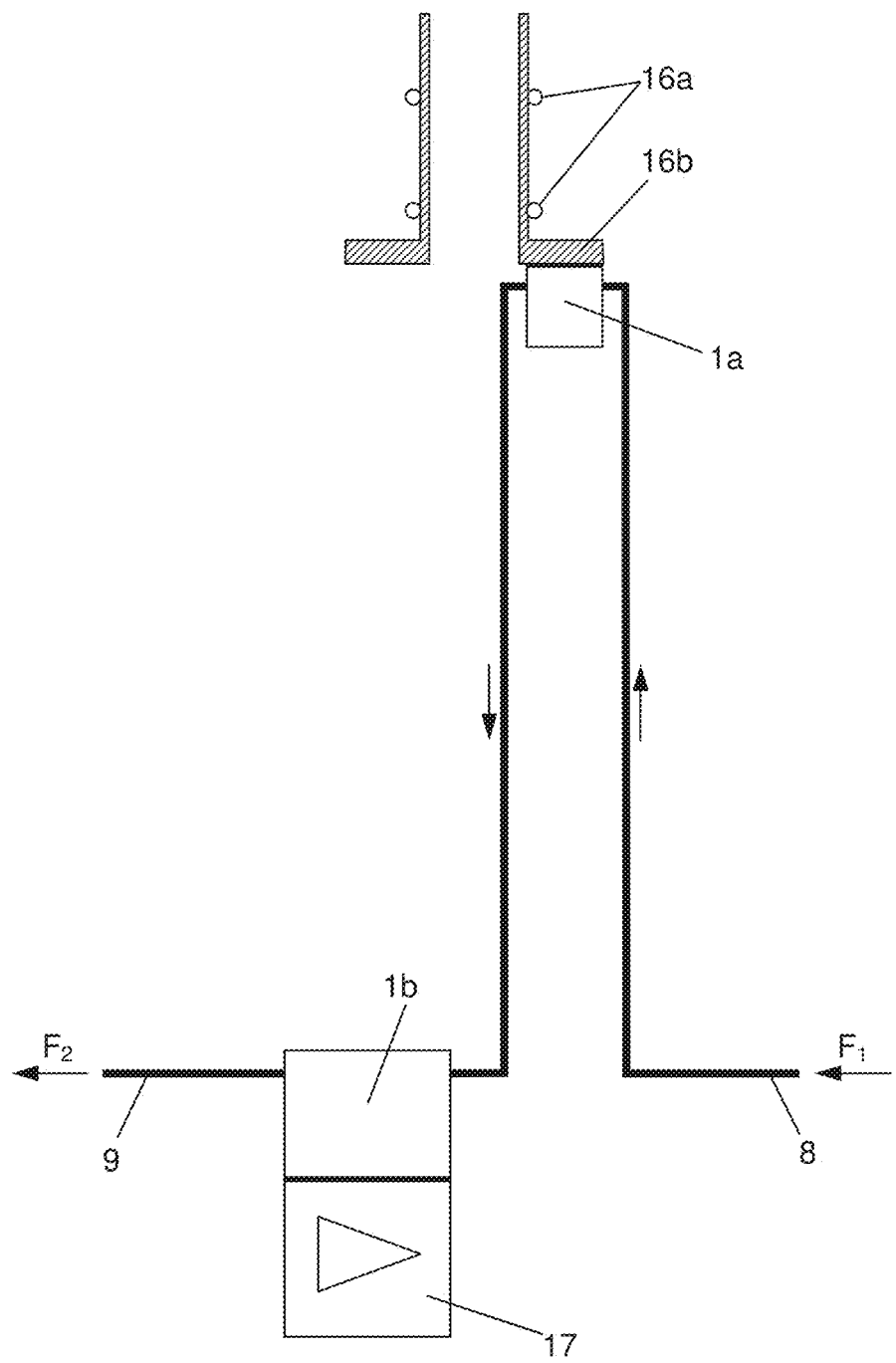
FIG. 19 Cooling of an NMR resonator with a mounting support and a signal amplifier similar to FIG. 15.

The RF resonators 16a including the mounting support 16b or the RF resonators 16a together with the signal amplifier 17 are cooled in an NMR probe head (FIG. 19). In this case, first the resonators 16a and then the signal amplifiers 17 can be supplied with fluid, or vice versa.

RF resonators and signal amplifiers each act as a heat source. The thermal load due to RF pulse sequences is absorbed by a cryogenic fluid in which the liquid component evaporates.

LIST OF REFERENCE SYMBOLS

1 Heat exchanger or container of the heat exchanger
1a Heat exchanger for cooling the NMR resonator
1b Heat exchanger for cooling the NMR signal amplifier
2 Inflow $F_1$ of the cryogenic fluid with the components $F_{1L}$ and $F_{1G}$, wherein $F_{1L}$ means the liquid and $F_{1G}$ means the gaseous component
3 Outflow $F_2$ of the cryogenic fluid with the components $F_{2L}$ and $F_{2G}$, wherein $F_{2L}$ means the liquid and $F_{2G}$ means the gaseous component
4, 4a, 4b Contact element with good thermal conduction in various embodiments
4.1 Subcomponent of the contact element
4.2 A further subcomponent of the contact element
5, 5a, 5b The heat source to be cooled
6 Liquid volume component $V_L$ of the cryogenic fluid in the container
7 Gaseous volume component $V_G$ of the cryogenic fluid in the container
8 Inflow conduit for $F_1$
9 Outflow conduit for $F_2$
10 Sensor for detecting the maximum desired level of the liquid volume component $V_L$
11 Sensor for detecting the minimum desired level of the liquid volume component $V_L$
12 Sensor for detecting the liquid component $F_{2L}$ in the outflow conduit 9
13 Temperature sensor on the heat source 5
14 Heater for closed-loop control of the temperature of the heat source 5
15, 15a, 15b Thermally insulating fastening element for the contact element
16a RF resonator
16b Mounting support of the RF resonator
17 Signal amplifier

We claim:
1. A method for cooling an RF resonator during a nuclear magnetic resonance (NMR) measurement on a sample, the RF resonator being disposed within a cryo probe head for reception of radio-frequency (=RF) signals emanating from the sample, the method comprising the steps of:

a) preparing at least one heat exchanger, wherein the heat exchanger has at least one contact element that connects the cryogenic fluid and the RF resonator, the heat exchanger having a container with an interior volume, the container being a buffer reservoir for a cryogenic fluid, wherein the container has an inflow conduit leading to the interior volume, the inflow conduit accepting cryogenic input flow of the cryogenic fluid into the interior volume, the cryogenic input flow having an inflow liquid component and an inflow gaseous component, the container also having an outflow conduit communicating with the interior volume, the outflow conduit accepting cryogenic output flow of the cryogenic fluid out of the interior volume, the cryogenic output flow having an outflow liquid component and an outflow gaseous component, wherein the contact element is in thermal contact with the RF resonator and with a liquid volume component of the cryogenic fluid in the container;
b) cooling, without generating vibrations caused by gas bubble formation, the RF resonator by evaporation of the cryogenic liquid disposed within the container; and
c) carrying out the NMR measurement during step b).

2. The method of claim 1, wherein the inflow conduit has a flow cross-section $Q_Z$ and a circumference $U_Z$ defining a hydraulic diameter $D_{hyd,Z}=4 \cdot Q_Z/U_Z$ and an associated parameter $V_Z=Q_Z \cdot D_{hyd,Z}$, with $V_B > 10 \cdot V_Z$, wherein $V_B$ is an interior volume of the container, the outflow conduit having a flow cross-section $Q_4$, wherein $Q_4 \geq Q_Z$, wherein the cryogenic input flow $F_1$ into the container is adjusted such that $F_{1L}/F_{1G} > F_{2L}/F_{2G}$, $F_{1L}$ being the inflow liquid component, $F_{1G}$ the inflow gaseous component, $F_{2L}$ the outflow liquid component and $F_{2G}$ the outflow gaseous component.

3. The method of claim 2, wherein the dimensions of the inflow conduit comply with $V_B \leq 150 \cdot V_Z$.

4. The method of claim 2, wherein a closed-loop control device regulates the cryogenic input flow $F_1$ into the container to maintain a volume component $V_L$ of cryogenic liquid in the container at a definable value relative to a volume component $V_G$ of gaseous cryogenic fluid.

5. The method of claim 4, wherein the closed-loop control device controls the cryogenic input flow $F_1$ into the container as a function of a quantity of heat transferred from the RF resonator through the contact element to the heat exchanger, wherein $V_G > V_L$.

6. The method of claim 4, wherein the closed-loop control device controls the cryogenic input flow $F_1$ into the container such that as much liquid component $F_{1L}$ flows into the heat exchanger as evaporates due to heat from the RF resonator.

7. The method of claim 4, wherein a temperature sensor measures a temperature of the RF resonator, the temperature sensor having an output signal fed to the closed-loop control device as an input signal for closed-loop control of the cryogenic input flow $F_1$ into the container.

8. The method of claim 4, wherein a level sensor measures a current level of the volume component $V_L$ of liquid cryogenic fluid in the container.

9. The method of claim 8, wherein the fluid inflow is increased by the device for setting the cryogenic input flow $F_1$ into the container in response to signaling that a current level of the volume component of liquid cryogenic fluid has fallen below a settable level.

10. The method of claim 8, wherein the fluid inflow is reduced or blocked by the device for setting the cryogenic input flow $F_1$ into the container in response to attainment of or to exceeding of a maximum liquid level, wherein fluid inflow is opened or increased in response to reaching or dropping below a minimum liquid level.

11. The method of claim 2, wherein a closed-loop temperature control regulates a temperature of the RF resonator, the temperature control comprising a closed-loop control device and a heater that is thermally connected to the RF resonator.

12. The method of claim 2, wherein the RF resonator is directly connected to a lower cover of the container.

13. The method of claim 2, wherein the RF resonator is directly connected to an upper cover of the container.

14. The method of claim 2, wherein the heat exchanger has two or more contact elements.

15. The method of claim 2, wherein the RF resonator is directly connected to an upper cover of the container, an interior of the container accommodating the contact element, wherein the contact element is permanently connected to the upper cover of the container and is immersed in the cryogenic liquid in the container, the contact element being disposed directly below the RF resonator.

16. The method of claim 2, wherein the contact element protrudes from a top of the heat exchanger, is attached to an upper cover of the heat exchanger and has a thermal connection to the RF resonator, wherein a lower part of the contact element is immersed in the cryogenic liquid in the container.

17. The method of claim 2, wherein the contact element is connected to a wall of the container below a level of the cryogenic liquid, the contact element thereby protruding into the container.

* * * * *